US010158326B2

(12) United States Patent
Calmel

(10) Patent No.: US 10,158,326 B2
(45) Date of Patent: Dec. 18, 2018

(54) AUDIO AMPLIFIER

(71) Applicant: DEVIALET, Paris (FR)

(72) Inventor: Pierre-Emmanuel Calmel, Le Chesnay (FR)

(73) Assignee: DEVIALET, Paris (FR)

( * ) Notice: Subject to any disclaimer, the term of this patent is extended or adjusted under 35 U.S.C. 154(b) by 0 days.

(21) Appl. No.: 15/322,311

(22) PCT Filed: Jun. 25, 2015

(86) PCT No.: PCT/EP2015/064383
§ 371 (c)(1),
(2) Date: Mar. 9, 2017

(87) PCT Pub. No.: WO2015/197764
PCT Pub. Date: Dec. 30, 2015

(65) Prior Publication Data
US 2017/0214365 A1    Jul. 27, 2017

(30) Foreign Application Priority Data

Jun. 25, 2014    (FR) ..................... 14 55935

(51) Int. Cl.
*H03F 3/68* (2006.01)
*H03F 1/02* (2006.01)
(Continued)

(52) U.S. Cl.
CPC ............. *H03F 1/0205* (2013.01); *H03F 1/34* (2013.01); *H03F 3/185* (2013.01); *H03F 3/211* (2013.01);
(Continued)

(58) Field of Classification Search
CPC . H03F 3/68; H03F 3/181; H03F 3/183; H03F 3/185
(Continued)

(56) References Cited

U.S. PATENT DOCUMENTS

2014/0050335 A1    2/2014    Moronvalle

FOREIGN PATENT DOCUMENTS

| WO | 199837731 A1 | 8/1998 |
|---|---|---|
| WO | 200042702 A1 | 7/2000 |

(Continued)

OTHER PUBLICATIONS

International Search Report and Written Opinion of the ISA dated Sep. 18, 2015 issued in corresponding PCT International Application No. PCT/EP2015/064383.
(Continued)

*Primary Examiner* — Steven J Mottola
(74) *Attorney, Agent, or Firm* — Troutman Sanders

(57) ABSTRACT

An audio amplifier has an input for an audio signal being amplified and an output powering a load on the basis of the amplified audio signal; a generator of reference voltage of very high linearity and low output impedance, able to receive, as input, the audio signal to be amplified; a power current generator including a power voltage generator whose output is connected to the output of the reference voltage generator through a coupling inductance; and a signal adder introducing, for its control, as input to the power current generator, a signal representative of the current provided as output by the reference voltage generator. The signal adder is able to introduce a signal $$\left(L\frac{di_{LOAD}}{dt}\right)$$

representative of the product of the value of the coupling inductance and the drift with respect to time of the current $$\left(\frac{di_{LOAD}}{dt}\right)$$

provided to the load.

10 Claims, 5 Drawing Sheets

(51) Int. Cl.
- *H03F 1/34* (2006.01)
- *H03F 3/21* (2006.01)
- *H03F 3/217* (2006.01)
- *H03F 3/185* (2006.01)
- *H03F 3/30* (2006.01)
- *H03F 3/45* (2006.01)

(52) U.S. Cl.
CPC ........... *H03F 3/217* (2013.01); *H03F 3/3001* (2013.01); *H03F 3/45475* (2013.01); *H03F 2200/03* (2013.01); *H03F 2203/45281* (2013.01)

(58) Field of Classification Search
USPC ..................... 381/120, 121; 330/84, 124 R
See application file for complete search history.

(56) References Cited

FOREIGN PATENT DOCUMENTS

| WO | WO 2009090065 A1 * | 7/2009 | ........... H03F 1/0277 |
|----|----|----|----|
| WO | 2011107669 A1 | 9/2011 | |

OTHER PUBLICATIONS

French Search Report dated Apr. 21, 2015 issued in corresponding French Application No. 1455935.

\* cited by examiner

AUDIO AMPLIFIER

CROSS-REFERENCE TO RELATED APPLICATIONS

This application is a National Stage of International Application No. PCT/EP2015/064383, filed Jun. 25, 2015. This application, in turn, claims priority to French Patent Application No. 1455935, filed Jun. 25, 2014. Both applications are incorporated herein by reference.

FIELD OF THE INVENTION

The present invention relates to a very high fidelity audio amplifier with low distortion and high performance of the type including:
- an input for an audio signal to be amplified and an output for powering a load on the basis of the amplified audio signal;
- a generator of reference voltage of very high linearity and low output impedance, able to receive, as input, the audio signal to be amplified;
- a power current generator including a power voltage generator whose output is connected to the output of the reference voltage generator through a coupling inductance; and
- means for introducing, for its control, as input to the power current generator, a signal representative of the current provided as output by the reference voltage generator.

BACKGROUND

Patent application WO-2011/107,669 describes the coupling of a class A analog amplifier, made up of a reference voltage generator and a class D digital amplifier constituting a power voltage generator, which is coupled to the output of the reference voltage generator by an inductance, with which it then forms a current source.

The combination of a class A amplifier and a class D amplifier is intended to create an amplifier with a very high performance and very high linearity.

In practice, several phenomena limit the total performance of such an amplifier, its ability to reproduce high frequencies, and its maximum achievable power. These phenomena are in particular the following.

The switching losses of the MOS transistors of the class D amplifier are proportional to the switching frequency. For this reason, in practice, this frequency cannot significantly exceed 500 kHz for voltages greater than 100 volts.

Furthermore, the value of the output inductance of the class D amplifier must be as small as possible to allow a maximum slew rate thus allowing high frequencies of the audio spectrum to be reproduced. However, decreasing the value of this inductance produces the following two harmful effects:
- the current ripple in the inductance of the class D amplifier is inversely proportional to the switching frequency and inversely proportional to the value of the inductance. Yet the high-frequency current ripple is completely absorbed and dissipated by the class A analog amplifier, which causes significant heat dissipation and decreases the performance of the system;
- the maximum authorized gain to remain within the stability limits in the case of proportional integral (PI) feedback control of the class D amplifier by the current consumed by the class A amplifier is directly proportional to the value of the inductance of the class D amplifier and inversely proportional to the sum of all of the time lags and delays of the system in particular consisting of the computing time lags of the microcontrollers and time lags inherent to the use of regulation of the PWM type.

The compromise that must be found between the technological constraints of switching transistors, the bandwidth to be reproduced and the typical impedance of the speakers to be powered leads to excessively low maximum proportional and integral gain values beyond about 10 kHz, reducing the ratio of the current supplied by the class A amplifier to the current supplied by the class D amplifier at 20 kHz to less than one tenth. At low frequencies, such gain problems do not exist, the integrator present in the control system having a very high gain.

The solution implemented in document WO 2011/107,669, consisting of adding the signal representative of the input voltage of the class A amplifier to the control signal of the class D amplifier, aims, without any current in the class A amplifier, after the integrator of the class D amplifier control system converges towards zero, for the voltage across the terminals of the coupling impedance and the current traversing this impedance to be zero irrespective of the input voltage. Yet this condition proves difficult to meet if the complex impedances of the load and the coupling inductance have different arguments, which is generally the case, primarily when the coupling impedance has a very low resistance and a high inductance, while the impedance of the load is essentially resistive.

Under these conditions, the class A amplifier is highly stressed when reproducing high frequencies, in particular exceeding 10 kHz.

SUMMARY

The invention aims to improve the ratio of current supplied by the class A amplifier to the current supplied by the class D amplifier for high frequencies, thus making it possible to reduce the heating of the class A amplifier while increasing the working bandwidth.

To that end, the invention relates to an audio amplifier of the aforementioned type, characterized in that said means for introducing, for its control, as input to the current generator, a signal representative of the current provided as output from the reference voltage generator, are moreover able to introduce a signal representative of the product of the value of the coupling inductance and the drift with respect to time of the current provided to the load.

According to specific embodiments, the acoustic enclosure includes one or more of the following features:
- the means for introducing, for its control, as input to the power current generator, a signal representative of the current provided as output by the reference voltage generator included a draft-proportional-integral regulator;
- the signal representative of the product of the value of the coupling inductance and the drift with respect to time of the current provided to the load is the product of the value of the coupling inductance and the drift with respect to time of the current provided to the load from the output;
- the means for introducing, for its control, as input to the power current generator, a signal representative of the current provided as output by the reference voltage generator, are able to introduce, as input of the current generator, a signal comprising both a signal representative of the audio signal to be amplified and the product of the value of the coupling inductance and the drift with respect to time of the current provided to the load from the output;

the means for introducing, for its control, as input to the power current generator, a signal representative of the current provided as output by the reference voltage generator, are able to introduce, as signal representative of the current provided at the output of the reference voltage generator, a signal comprising the product of the value of the coupling inductance and the value of the current provided at the output of the reference voltage generator;

said amplifier includes means for measuring the current provided at the output of the power voltage generator and means for computing the value of the coupling inductance based on the current provided at the output of the power voltage generator;

said amplifier includes, on the one hand, means for estimating the current provided at the output of the power voltage generator from the current provided at the output of the reference voltage generator and a signal representative of the audio signal to be amplified, and, on the other hand, means for computing the value of the coupling inductance based on the current provided at the output of the power voltage generator;

said means for estimating the current provided at the output of the power voltage generator include a stage for integrating the quotient of the difference between the control signal of the power current generator and the signal representative of the audio signal to be amplified divided by an estimate of the value of the coupling inductance;

the means for introducing, for its control, as input to the current generator, a signal representative of the current provided as output by the reference voltage generator and a signal representative of the product of the value of the coupling inductance and the drift with respect to time of the current provided to the load comprise reintroducing the control signal of the power current generator with a predetermined delay at the input of the power current generator; and the value of the coupling inductance is greater than 1 micro Henry and the means for introducing, for its control, as input to the current generator, a signal representative of the current provided as output by the reference voltage generator and a signal representative of the product of the value of the coupling inductance and the drift with respect to time of the current provided to the load comprise only one means for reintroducing the control signal of the power current generator with a predetermined delay at the input of the power current generator.

BRIEF DESCRIPTION OF THE DRAWINGS

The invention will be better understood upon reading the following description, provided solely as an example and done in reference to the drawings, in which.

DETAILED DESCRIPTION

Figure 1:
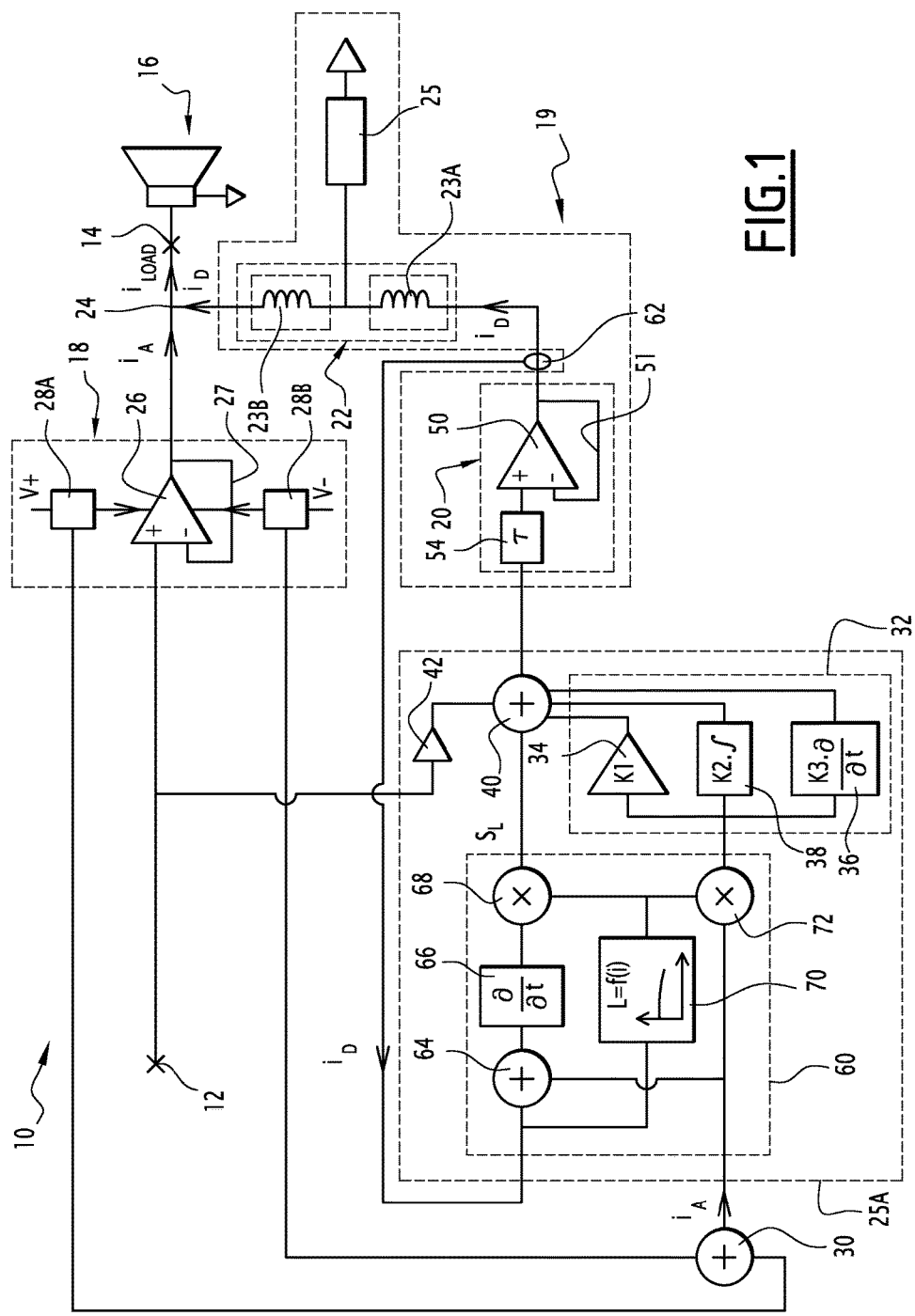
FIG. 1 is an electrical diagram of a high-fidelity audio amplifier with low distortion and very high performance according to a first embodiment of the invention.

The audio amplifier 10 shown in FIG. 1 includes an input 12 able to receive an analog audio signal to be amplified $V_{in}$ and an output 14 providing the amplified signal to which a load consisting of a speaker 16 is connected. The speaker 16 is directly connected, without the resistive element, between the output 14 of the amplifier and the ground.

The input 12 of the amplifier is able to receive a control voltage, the reference of which is the ground.

The amplifier 10 includes a reference voltage generator 18 with a very high linearity and low output impedance forming a class A amplifier and a power current source 19 forming a class D amplifier, both outputs of which are directly coupled to form the output 14 of the amplifier.

The power current source 19 comprises a power voltage generator 20 and a coupling inductance 22 connected at the output of the power voltage generator 20 and through which the voltage generator 20 is coupled to the reference voltage generator 18. The coupling inductance is formed by a spool having a low resistance.

The input of the reference voltage generator 18 is connected to the input 12 of the amplifier, while the output of the reference voltage amplifier 18 is directly connected to the output 14 without inserting any resistive, capacitive or inductive element.

The outputs of the voltage generators 18 and 20 are connected at a coupling point 24, the coupling inductance 22 being arranged between the output of the power voltage generator 20 and the coupling point 24.

In the considered embodiment, the coupling inductance 22 comprises two inductances 23A, 23B mounted in series and the interconnection midpoint of which is connected to the ground by a connecting impedance 25.

The total inductance of the coupling inductance 22 is comprised between 1 micro Henry and 1 milli Henry. The power current generator 20 is controlled by a control unit 25A.

The reference voltage generator 18 includes a voltage amplifying stage 26 diagrammed by a differential amplifier whose non-inverting input is directly connected to the input 12 and whose inverting input is connected to an inverse feedback loop 27 directly connected to the output of the differential amplifier 26. Preferably, the voltage amplifying stage is for example formed by an operational amplifier mounted as a voltage follower.

The reference voltage generator 18 is a class A amplifier having a very high linearity and a low output impedance. Preferably, the output impedance of the reference voltage generator is less than 0.2 Ohms.

The differential amplifier 26 is powered by two direct voltages $V_+$ and $V_-$ and consumes a current respectively denoted $I_+$ and $I_-$ on each of these power inputs.

Means for measuring the consumed current 28A, 28B are provided on each of the power inputs of the differential amplifier 26.

These means are for example formed by current detectors, as described in document U.S. Pat. No. 6,937,095. They are able to provide information representative of the current provided at the output by the reference voltage generator, the current $i_A$ formed by the generator 18 being directly related to the current it consumes.

The outputs of the current sensors 28A, 28B are connected to a summer 30 whose output provides the current $i_A$ consumed by the reference voltage generator and therefore the current provided at the output of this same amplifier. The control unit 25A includes a linear regulator 32 receiving the current $i_A$ as input while being connected to the output of the summer 30.

The regulator 32 includes a linear amplifying stage 34, a derivative stage 36 and an integration stage 38 each mounted in parallel and receiving, as input, a value representative of the sum of the currents $i_A$ consumed by the reference voltage generator 18. The outputs 34, 36 and 38 are connected to a summer 40 of the control unit 25A. Thus, the regulator 32 is able to provide, as output, a signal representative of the current provided as output by the reference generator 18.

According to a first embodiment, the regulator 32 is a proportional integral (PI) regulator integrating only a linear amplifying stage 32 and an integration stage 38 with no derivative stage 36. Alternatively, the regulator 32 is a proportional integral derivative (PID) stage including all three stages 34, 36 and 38.

The summer 40 is connected by another input to the input 12, via a linear amplifying stage 42 to receive the musical signal $V_{in}$ to be amplified.

Thus, the power current generator 19 and therefore the power voltage generator 20 are able to receive, as input, a combination of the audio signal to be amplified $V_{in}$ from the input 12 and a value representative of the current $i_A$ consumed by the reference voltage generator 18.

In the considered example, the power voltage generator 20 is made up of a differential amplifier 50 mounted as a follower, and the inverting input of which is directly connected to the output by an inverse feedback loop 51. Its non-inverting input is connected to the output of the control unit 25A formed by the output of the summer 40 through a delay stage 54.

According to a first embodiment, the differential amplifier 50 is made up of a class D amplifier, i.e., an amplifier of the "push/pull" type, including, along its amplifier branch, two "MOSFET" transistors mounted in anti-series, these two transistors being controlled using a pulse width modulation law. In this case, the impedance 22 is made up of an inductance, a resistance or both. Alternatively, both transistors are controlled using a sigma/delta law According to another embodiment, the power voltage generator 20 is made up of a class A or class AB amplifier.

Advantageously, the coupling inductance 22, whether it involves a spool or a resistance, has a modulus less than ten times the modulus of the load, i.e., of the speaker 16, in the working frequency range.

Thus, for example, for a speaker whose resistance is 8 Ohms, the inductance 22 used in the case of a class AB amplifier to form the power current generator 19 is less than 10 µH.

Likewise, in the case of a class D amplifier forming the power voltage generator 20, to power a speaker whose inductance is 1 mH and whose resistance is 4 Ohms, the coupling inductance has a value below 100 µH.

According to the invention, the control unit 25A of the current generator 19 includes means 60 for introducing, for its control, as input to the current generator 19, in addition to the signal representative of the current provided as output by the reference voltage generator 18, a signal $S_L$ representative of the value of the coupling inductance 22. The output of the means 60 is connected to an input of the summer 40 to take the signal $S_L$ into account.

In the embodiment of FIG. 1, these means 60 are connected at their input to a stage 62 for measuring the current $I_D$ provided at the output of the power voltage generator 20 and circulating through the coupling inductance 22. This stage 62 is connected to a summer 64 of the stage 60 whose other input is connected to the output of the summer 30 to receive the intensity $i_A$ provided at the output of the voltage generator 18. Thus, at the output of the summer 64, the intensity $i_{LOAD}$ provided to the load 16 at the output 14 of the amplifier is obtained, this intensity being equal to the sum of the intensity $i_A$ provided at the output of the voltage generator and the intensity $i_D$ provided at the output of the power current generator 19. The output of the summer 64 is connected to a derivative stage with respect to the time 66 able to provide $$\frac{\partial i_{LOAD}}{\partial t}$$

as output.

This output is connected to a multiplier 68, the other input terminal of which is connected to a stage 70 providing a value $L(i_D)$ of the coupling inductance 22 as a function of the current $i_D$ traversing it. This stage 70 includes an input able to receive the intensity $i_D$ traversing the inductance 22, this input being connected to the measuring stage 62. The unit 70 is for example made up of a table of prerecorded values able to provide, as output, the value $L(i_D)$ of the inductance 22 as a function of the intensity circulating in this inductance.

The output of the multiplier 68 is connected to the input of the summer 40 and provides the signal $S_L$, which is equal to the product of the coupling inductance $L(i_D)$ and the derivative with respect to time of the current provided to the load from the output 14, or $$S_L = L(i_D) \frac{\partial i_{LOAD}}{\partial t}.$$

Advantageously, the output of the unit for computing the value of the coupling inductance 70 is connected to an input of a multiplier 72, the other input of which is connected to the output of the summer 30. The output of the multiplier 72 is connected to the input of the regulator 32, allowing the regulator 32 to receive, as signal representative of the current $i_A$ provided at the output of the reference voltage generator 18, a signal $Li_A$ representative of the product of the value of the coupling inductance 22 and the current $i_A$ provided at the output of the reference voltage generator 18.

It will be understood that with such a circuit, the voltage added to control the power current generator 19, in addition to the output of the regulator 32, is equal to $$V = V_{in} + L \frac{di_{LOAD}}{dt}.$$

If the output of the regulator 32 is equal to zero (the reference voltage generator 18 is then not providing any current), since the reference 18 and power 20 generators have a unitary gain, the voltage at the point 24 is equal to Vin and the output voltage of the reference voltage generator 20 is equal to $$V = V_{in} + L\frac{di_{LOAD}}{dt}.$$

The voltage across the terminals of the inductance 22 is then equal to the difference of the two preceding voltages, i.e.:

$$V_L = V_{in} - \left(V_{in} + L\frac{di_{LOAD}}{dt}\right) = -L\frac{di_{LOAD}}{dt}.$$

It immediately follows from this that the inductance 22 is traveled by the current $i_{LOAD}$, since an inductance L traversed by a current i experiences, at its terminals, a difference in potential equal to $$-L\frac{di}{dt}.$$

Under these conditions, all of the current provided to the load 16 comes from the power voltage generator 20. The signal $$V = V_{in} + L\frac{di_{LOAD}}{dt}$$

is therefore a perfect estimator of the voltage to be provided to the generator 20 in order to maximize the ratio $$\frac{i_D}{i_A}.$$

It should be noted that the preceding result is true irrespective of the load 16 connected at the output 14 of the amplifier 10, irrespective of the frequency of the amplified signal, and irrespective of the gain of the feedback control of the amplifier 50. Thus, in theory, the class A reference voltage generator 18 does not provide any current; in practice, the class A reference voltage generator settles for providing a weak current intended to correct the small imperfections in the performance of each elementary function (differentiator, integrator, value of L 22, etc.).

One can see that the value of the inductance $L(i_D)$ varying greatly (up to −50%), and completely nonlinearly based on the current $i_D$ that traverses it, the circuit according to the invention furthermore makes it possible on the one hand, to modulate the value of L used in the computation by the estimator of the voltage to be provided to the power voltage generator 20 based on the current traversing it, and on the other hand to modulate the gain of the inverse feedback of the feedback control through the nonlinear function linking the value of $L(i_D)$ to its current $i_D$ traversing it, so as to be able to maximize the gains of the feedback control for any value of the current traversing the inductance 22 and to avoid having, when designing the amplifier, to provide a ratio 2 for the gain margin solely to take into account the 50% decrease in the value of the coupling inductance L on the current peaks.

Figure 2:
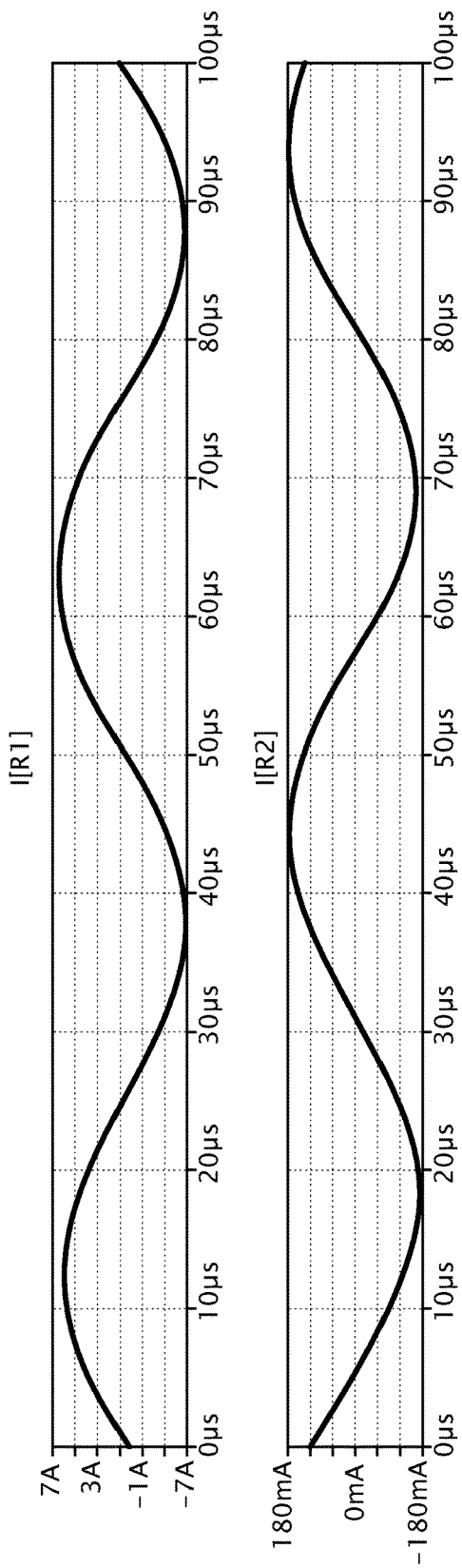
FIG. 2 is a graph showing the value of the current provided by the class A amplifier without the invention and when the invention is implemented.

One can see that adding the correction substantially reduces the value of the current provided by the class A amplifier to 20 kHz, as illustrated in FIG. 2.

The peak current of the class A amplifier is then only 150 milliamperes (bottom curve) instead of the 1500 milliamperes of the state of the art illustrated in the top curve of FIG. 2. The dissipation in the class A amplifier is then divided by about ten, which breaks down as follows:

ratio 2 related to the possible doubling of the gains when the current in the inductance is much lower than the saturation current; and a ratio 5 related to the introduction of the new voltage setpoint.

In the following figures, illustrating alternative embodiments of the amplifier according to the invention, the same reference numbers as those of FIG. 1 are used to designate identical or corresponding elements.

Figure 3:
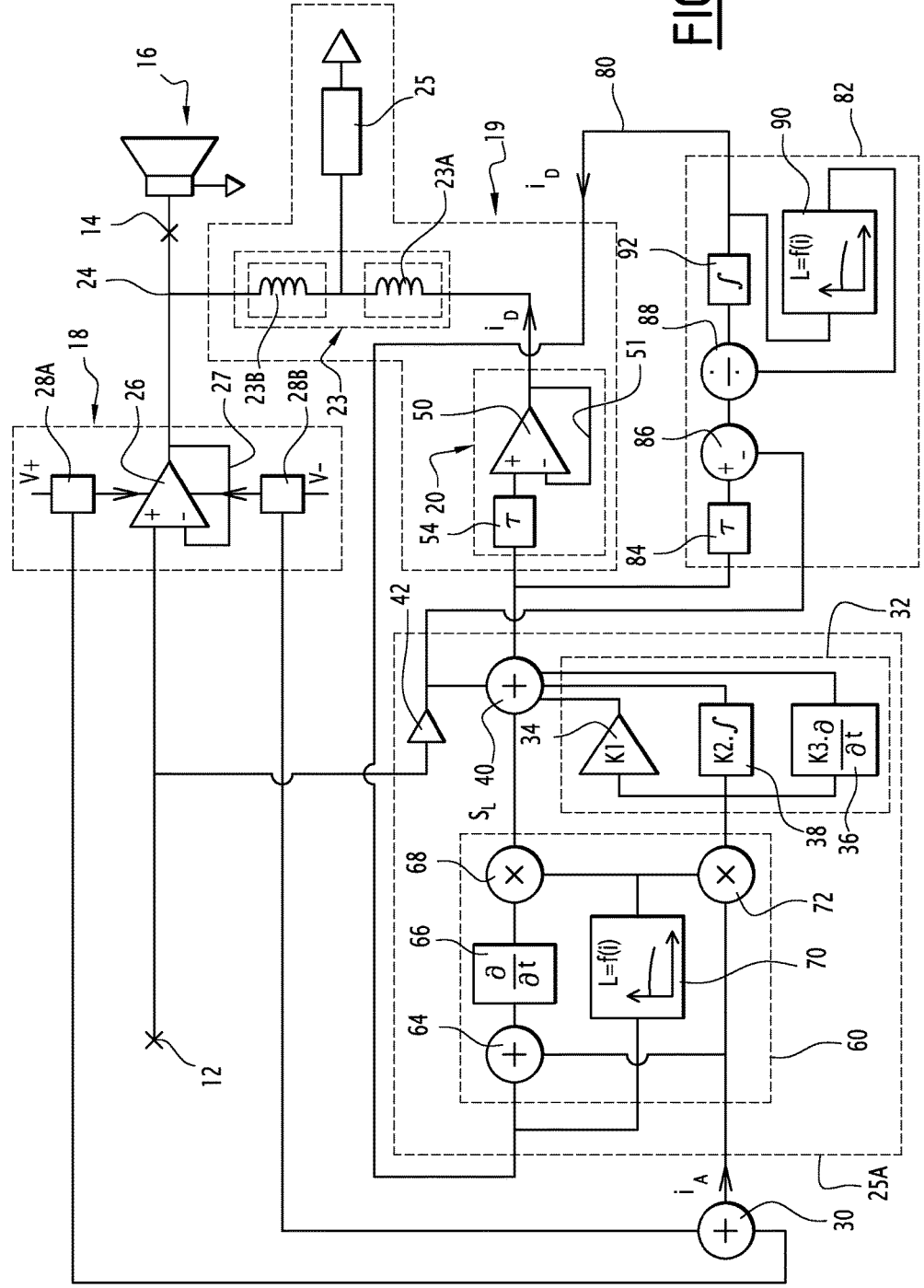
FIG. 3 is an electrical diagram of an alternative embodiment of an amplifier according to the invention.

The alternative embodiment illustrated in FIG. 3 has no unit 62 for measuring the current $i_D$ provided at the output of the power voltage generator. This unit 62 is replaced by a unit 82 for estimating the current $i_D$ provided at the output of the power voltage generator 20.

The estimator 82 includes a first input connected to the output of the linear amplifying stage 42 to receive the musical signal $V_{in}$ to be amplified. The second input is connected to the output of the control unit 25A of the power current generator 19. This input is connected to a delay unit 84 identical to the delay unit 54.

The output of the unit 84 is connected to a subtracting stage 86 whose other input is connected to the output of the linear amplifier stage 42 to receive the musical signal $V_{IM}$ to be amplified. Thus, the subtracter 86 is able to compute the difference between the control signal introduced at the input of the power current generator 19 delayed by a delay τ and the musical signal $V_{IM}$ to be amplified. The output of the subtracter 86 is connected to an input of a divider 88 whose other input is connected to a unit 90 for computing the value of the coupling inductance 22 based on the intensity traversing it. This divider 88 is able to divide the difference from the subtracter 86 by the computed inductance L.

This quantity is introduced into an integrator 92 whose output provides an estimate of the intensity $i_D$ provided by the reference voltage generator 20. The output of the integrator 92 is also connected to the input of the unit 90 for estimating the value of the coupling inductance L in order to provide, at the output thereof, the inductance based on the estimated intensity $i_D$.

It will be understood that with this embodiment, the same advantages as before are obtained, without it being necessary to have a unit for measuring the intensity $i_d$, said intensity then only being estimated.

The estimator works here by integrating the difference in potential estimated at the edges of the coupling inductance 22 and uses the current or previous value of the estimator to perform a nonlinear computation of an estimate of the value L based on the current $i_D$ traversing it.

Figure 4:
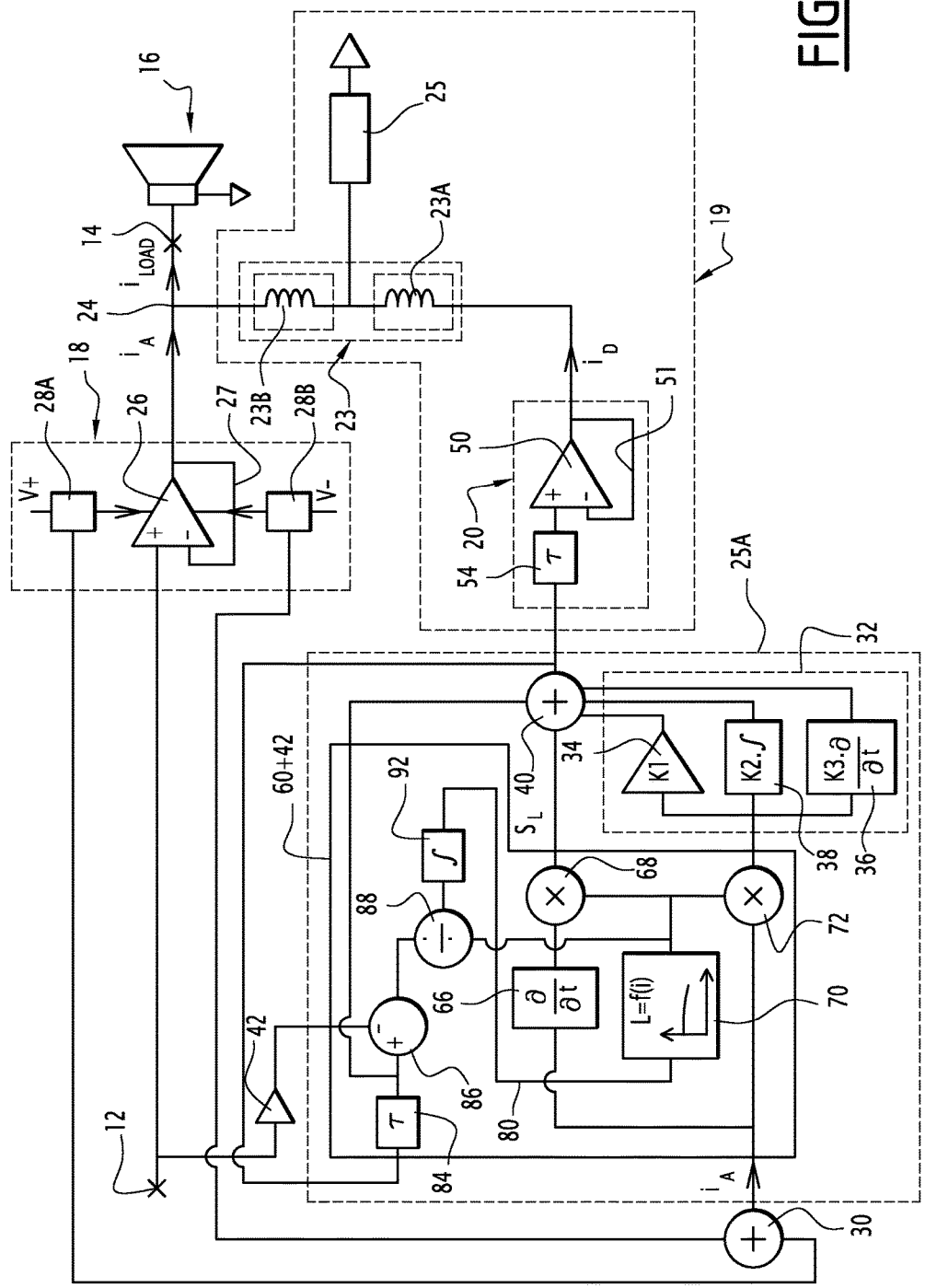
FIG. 4 is an electrical diagram of another alternative embodiment of an amplifier according to the invention.

As illustrated in FIG. 4, it is possible to rearrange and simplify certain computing units implemented in the estimator and in the means 60 to reduce rounding errors, in particular derivatives. This rearrangement uses the following mathematical properties:

the derivative of a sum is equal to the sum of the derivatives the derivative of the integral of a function is equal to that function addition is commutative and associative.

In this embodiment of FIG. 4, the estimator of the current $i_D$ is present, but the output of this estimator is no longer used at the input of the control unit 25A, but rather only to determine the value L of the inductance 22 based on the current traversing it. Thus, in this embodiment, the summer 64 of FIGS. 1 and 3 is eliminated. This is made possible because inverse integration and derivation operations are performed in the units 92 and 66.

Figure 5:
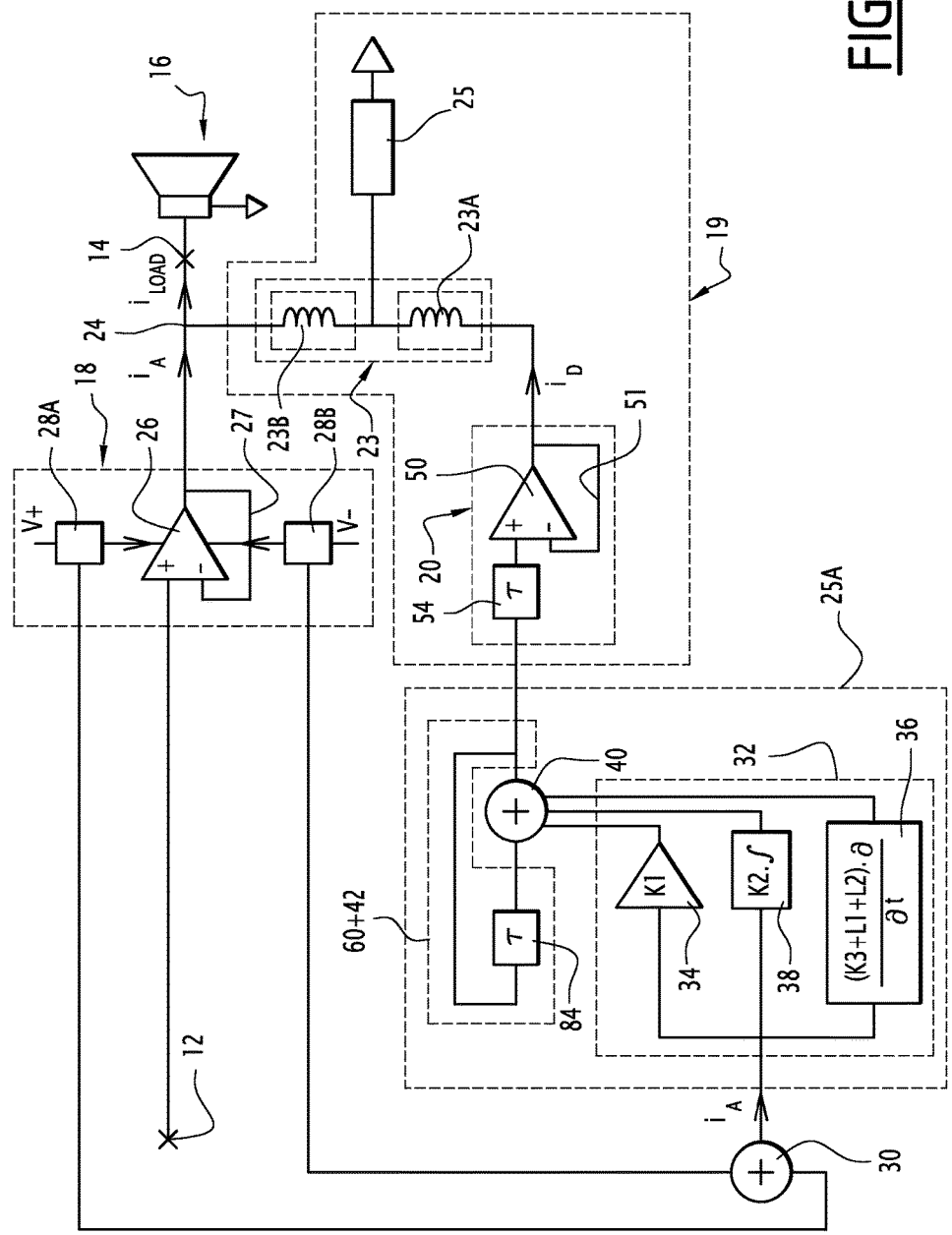
FIG. 5 is an electrical diagram of yet another alternative embodiment of an amplifier according to the invention.

In the case of FIG. 5, the value L of the coupling inductance is assumed not to depend on the intensity $i_D$ traversing it. This is made possible because the inductance 22 is assumed to have a coupling inductance value that is oversized in terms of current and for which the magnetic saturation phenomena are negligible. Alternatively, the inductance 22 can be made without using ferromagnetic materials (air inductance) or have a gap in its magnetic circuit. The magnetic saturation phenomena are considered to be negligible when they are less than 10% saturation. A coupling inductance oversized in this way has a value comprised between 0.1 µH and 100 µH for current of 50 A.

In this case, the control block is simplified and the summer 40 only receives the control signal delayed by a delay τ by the delay unit 84 as input.

According to another embodiment, the value representative of the current provided by the reference voltage generator introduced into the PID regulator 32 is given by the difference in the potentials measured across the terminals of the inductance 22 and a complementary resistance arranged between the coupling point 24 and the output 14 according to the assembly described in document FR 2,873,872.

The invention claim is:

1. An audio amplifier, comprising:
an input of an audio signal to be amplified and an output powering a load on the basis of the amplified audio signal;
a reference voltage generator, able to receive, as input, the audio signal to be amplified;
a power current generator comprising a power voltage generator whose output is connected to the output of the reference voltage generator through a coupling inductance;
a signal adder introducing, for its control, as input to the power current generator, a signal representative of the current provided as output by the reference voltage generator;
wherein:
said signal adder is moreover able to introduce a signal $$\left(L\frac{di_{LOAD}}{dt}\right)$$

representative of the product of the value of the coupling inductance and the drift with respect to time of the current $$\left(\frac{di_{LOAD}}{dt}\right)$$

provided to the load.

2. The amplifier according to claim 1, wherein the signal adder comprises a derivative-proportional-integral (PID) regulator.

3. The amplifier according to claim 1, wherein the signal $$\left(L\frac{di_{LOAD}}{dt}\right)$$

representative of the product of the value of the coupling inductance and the drift with respect to time of the current $$\left(\frac{di_{LOAD}}{dt}\right)$$

provided to the load is the product of the value of the coupling inductance and the drift with respect to time of the current $$\left(\frac{di_{LOAD}}{dt}\right)$$

provided to the load from the output.

4. The amplifier according to claim 2, wherein the signal adder is able to introduce, as input of the current generator, a signal comprising both a signal representative of the audio signal to be amplified and the product of the value of the coupling inductance and the drift with respect to time of the current $$\left(\frac{di_{LOAD}}{dt}\right)$$

provided to the load from the output.

5. The amplifier according to claim 1, wherein the signal adder is able to introduce, as signal representative of the current provided at the output of the reference voltage generator, a signal comprising the product of the value of the coupling inductance and the value of the current provided at the output of the reference voltage generator.

6. The amplifier according to claim 1, further comprises a current measurer measuring the current provided at the output of the power voltage generator and a processor computing the value of the coupling inductance based on the current provided at the output of the power voltage generator.

7. The amplifier according to claim 1, further comprises at least one of an estimator estimating the current provided at the output of the power voltage generator from the current provided at the output of the reference voltage generator and a signal representative of the audio signal to be amplified, and, a processor computing the value of the coupling inductance based on the current provided at the output of the power voltage generator.

8. The amplifier according to claim 7, wherein the estimator estimating the current provided at the output of the power voltage generator include a stage integrating the quotient of the difference between the control signal of the power current generator and the signal representative of the audio signal to be amplified divided by an estimate of the value of the coupling inductance.

9. The amplifier according to claim 3, wherein the signal adder and a signal $$\left(L\frac{di_{LOAD}}{dt}\right)$$

representative of the product of the value of the coupling inductance and the drift with respect to time of the current $$\left(\frac{di_{LOAD}}{dt}\right)$$

provided to the load comprise reintroducing the control signal of the power current generator with a predetermined delay at the input of the power current generator.

10. The amplifier according to claim 9, wherein the value of the coupling inductance is greater than 1 micro Henry and the signal adder and a signal $$\left(L\frac{di_{LOAD}}{dt}\right)$$

representative of the product of the value of the coupling inductance and the drift with respect to time of the current $$\left(\frac{di_{LOAD}}{dt}\right)$$

provided to the load comprise a device reintroducing the control signal of the power current generator with a predetermined delay at the input of the power current generator.

* * * * *